United States Patent
Lin et al.

(10) Patent No.: US 9,819,144 B2
(45) Date of Patent: Nov. 14, 2017

(54) HIGH-EFFICIENCY VERTICAL EMITTERS WITH IMPROVED HEAT SINKING

(71) Applicant: Apple Inc., Cupertino, CA (US)

(72) Inventors: Chin Han Lin, Cupertino, CA (US);
Kevin A. Sawyer, Cupertino, CA (US);
Neil MacKinnon, San Jose, CA (US);
Venkataram R. Raju, Milpitas, CA (US); Weiping Li, Pleasanton, CA (US); Xiaofeng Fan, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/019,981

(22) Filed: Feb. 10, 2016

(65) Prior Publication Data

US 2016/0336717 A1 Nov. 17, 2016

(51) Int. Cl.
| | | |
|---|---|---|
| H01S 3/04 | (2006.01) | |
| H01S 5/024 | (2006.01) | |
| H01S 5/42 | (2006.01) | |
| H01S 5/00 | (2006.01) | |
| H01S 5/02 | (2006.01) | |
| H01S 5/022 | (2006.01) | |

(52) U.S. Cl.
CPC .......... *H01S 5/02469* (2013.01); *H01S 5/423* (2013.01); *H01S 5/0042* (2013.01); *H01S 5/0217* (2013.01); *H01S 5/0224* (2013.01)

(58) Field of Classification Search
CPC .... H01S 5/02469; H01S 5/423; H01S 5/0042; H01S 5/0217; H01S 5/0224; H01S 5/0206; H01S 5/02415; H01S 5/42; H01S 5/426; H01S 5/183; H01S 5/18305; H01S 5/3013
See application file for complete search history.

(56) References Cited

U.S. PATENT DOCUMENTS

| | | |
|---|---|---|
| 4,069,463 A | 1/1978 | McGroddy et al. |
| 5,812,571 A | 9/1998 | Peters |
| 6,156,980 A | 12/2000 | Peugh et al. |

(Continued)

OTHER PUBLICATIONS

Emanuel P. Haglund et. al "Silicon-integrated short-wavelength hybridcavity VCSEL" Dec. 28, 2015 | vol. 23, No. 26 Optics Express pp. 33634-33640.*

(Continued)

*Primary Examiner* — Xinning Niu
*Assistant Examiner* — Delma R Forde
(74) *Attorney, Agent, or Firm* — D. Kligler IP Services Ltd.

(57) ABSTRACT

A method for production of an optoelectronic device includes fabricating a plurality of vertical emitters on a semiconductor substrate. Respective top surfaces of the emitters are bonded to a heat sink, after which the semiconductor substrate is removed below respective bottom surfaces of the emitters. Both anode and cathode contacts are attached to the bottom surfaces so as to drive the emitters to emit light from the bottom surfaces. In another embodiment, the upper surface of a semiconductor substrate is bonded to a carrier substrate having through-holes that are aligned with respective top surfaces of the emitters, after which the semiconductor substrate is removed below respective bottom surfaces of the emitters, and the respective bottom surfaces of the emitters are bonded to a heat sink.

13 Claims, 4 Drawing Sheets

(56) References Cited

U.S. PATENT DOCUMENTS

| | | |
|---|---|---|
| 6,597,713 B2 | 7/2003 | Ouchi |
| 6,674,948 B2 | 1/2004 | Yeh et al. |
| 6,936,855 B1 | 8/2005 | Harrah |
| 7,126,218 B1 | 10/2006 | Darveaux et al. |
| 7,271,461 B2 | 9/2007 | Dutta |
| 7,303,005 B2 | 12/2007 | Reis et al. |
| 7,800,067 B1 | 9/2010 | Rajavel et al. |
| 7,949,024 B2 | 5/2011 | Joseph |
| 8,193,482 B2 | 6/2012 | Itsler |
| 8,259,293 B2 | 9/2012 | Andreou |
| 8,275,270 B2 | 9/2012 | Shushakov et al. |
| 8,355,117 B2 | 1/2013 | Niclass |
| 8,405,020 B2 | 3/2013 | Menge |
| 8,604,603 B2 | 12/2013 | Lau et al. |
| 8,654,811 B2 * | 2/2014 | Geske .................. H01S 5/0425 372/43.01 |
| 8,766,164 B2 | 7/2014 | Sanfilippo et al. |
| 8,963,069 B2 | 2/2015 | Drader et al. |
| 9,024,246 B2 | 5/2015 | Jiang et al. |
| 9,052,356 B2 | 6/2015 | Chu et al. |
| 9,076,707 B2 | 7/2015 | Harmon |
| 9,106,849 B2 | 8/2015 | Duggal et al. |
| 2002/0070443 A1 | 6/2002 | Mu et al. |
| 2002/0127752 A1 | 9/2002 | Thompson et al. |
| 2002/0176459 A1 * | 11/2002 | Martinsen .......... H01S 5/02461 372/34 |
| 2003/0081385 A1 | 5/2003 | Mochizuki et al. |
| 2004/0001317 A1 | 1/2004 | Getz, Jr. et al. |
| 2007/0262441 A1 | 11/2007 | Chen |
| 2010/0164079 A1 * | 7/2010 | Dekker .............. H01L 21/4846 257/676 |
| 2012/0051384 A1 * | 3/2012 | Geske .................. H01S 5/0425 372/50.124 |
| 2013/0015331 A1 | 1/2013 | Birk et al. |
| 2013/0163627 A1 | 6/2013 | Seurin et al. |
| 2013/0342835 A1 | 12/2013 | Blacksberg |
| 2014/0231630 A1 | 8/2014 | Rae et al. |
| 2014/0348192 A1 * | 11/2014 | Pruijmboom ........... H01L 24/04 372/36 |
| 2014/0353471 A1 | 12/2014 | Raynor et al. |
| 2015/0092802 A1 * | 4/2015 | Gronenborn ........ H01S 5/18397 372/36 |
| 2015/0163429 A1 | 6/2015 | Dai et al. |
| 2015/0200222 A1 | 7/2015 | Webster |
| 2015/0200314 A1 | 7/2015 | Webster |
| 2015/0255955 A1 * | 9/2015 | Wang ................... H01S 5/0224 438/29 |
| 2016/0300825 A1 * | 10/2016 | Hoeppel ............. H01L 33/0079 |

OTHER PUBLICATIONS

Jean-Francois Seurin et. al "Progress in high-power high-efficiency VCSEL arrays" Vertical-Cavity Surface-Emitting Lasers XIII of SPIE vol. 7229, 2009, pp. 722903-1 to 722903-11.*
U.S. Appl. No. 15/011,562 Office Action dated Dec. 27, 2016.
U.S. Appl. No. 15/145,828 Office Action dated Dec. 20, 2016.
Charbon et al., "SPAD-Based Sensors", TOF Range-Imaging Cameras, Springer-Verlag, pp. 11-38, year 2013.
Niclass et al., "A 0.18 um CMOS SoC for a 100m range, 10 fps 200×96 pixel Time of Flight depth sensor", IEEE International Solid- State Circuits Conference- (ISSCC), Session 27, Image Sensors, 27.6, pp. 488-490, Feb. 20, 2013.
Walker et al., "A 128×96 pixel event-driven phase-domain ΔΣ-based fully digital 3D camera in 0.13μm CMOS imaging technology", IEEE International Solid- State Circuits Conference- (ISSCC), Session 23, Image Sensors, 23.6, pp. 410-412, Feb. 23, 2011.
Mandai et al.,U.S. Appl. No. 14/975,790, filed Dec. 20, 2015.
Pyper et al., U.S. Appl. No. 15/145,828, filed May 4, 2016.
Jiang et al., U.S. Appl. No. 15/011,562, filed Jan. 31, 2016.
Roscher., "Flip-Chip Integration of 2-D 850nm Backside Emitting Vertical Cavity Laser Diode Arrays", Annual Report Optoelectronics Department, University of Ulm, 6 Pages, 2002.
U.S. Appl. No. 15/145,828 Office Action dated Jun. 2, 2017.

* cited by examiner

HIGH-EFFICIENCY VERTICAL EMITTERS WITH IMPROVED HEAT SINKING

CROSS-REFERENCE TO RELATED APPLICATION

This application claims the benefit of U.S. Provisional Patent Application 62/161,283, filed May 14, 2015, which is incorporated herein by reference.

FIELD OF THE INVENTION

The present invention relates generally to semiconductor devices, and particularly to optoelectronic devices and methods for their manufacture.

BACKGROUND

In conventional, top-emitting optoelectronic devices, such as vertical-cavity surface-emitting lasers (VCSELs), the semiconductor substrate serves not only as the base for fabrication of the emitters, but also as the mechanical supporting carrier of the emitter devices after fabrication. The terms "top" and "front" are used synonymously in the present description and in the claims in the conventional sense in which these terms are used in the art, to refer to the side of the semiconductor substrate on which the VCSELs are formed (typically by epitaxial layer growth and etching). The terms "bottom" and "back" refer to the opposite side of the semiconductor substrate. These terms are arbitrary, since once fabricated, the VCSELs will emit light in any desired orientation.

An attempt to create bottom-emitting VCSEL devices was reported by Roscher, in "Flip-Chip Integration of 2-D 850 nm Backside Emitting Vertical Cavity Laser Diode Arrays" (Annual Report 2002, Optoelectronics Department, University of Ulm). According to this report, arrays of substrate-side emitting VCSELs were directly hybridized onto silicon fanouts by means of an indium solder bump flip-chip technology, using electrical contacts formed on the top side of the VCSEL wafer.

SUMMARY

Embodiments of the present invention that are described hereinbelow provide improved optoelectronic devices and methods for their production.

There is therefore provided, in accordance with an embodiment of the invention, a method for production of an optoelectronic device, which includes fabricating a plurality of vertical emitters on a semiconductor substrate. Respective top surfaces of the emitters are bonded to a heat sink. After bonding the top surfaces, the semiconductor substrate is removed below respective bottom surfaces of the emitters. Both anode and cathode contacts are attached to the bottom surfaces so as to drive the emitters to emit light from the bottom surfaces.

In a disclosed embodiment, the method includes testing the emitters by applying currents between the anode and cathode comments. After testing the emitters, the heat sink is diced along with the emitters bonded thereto.

In some embodiments, bonding the top surfaces includes soldering the top surfaces to a conducting layer at a lower surface of the heat sink. Typically, fabricating the plurality of the vertical emitters includes depositing epitaxial layers on the semiconductor substrate, and attaching the anode contact includes etching a via through the epitaxial layers, and extending the anode contact through the via to the conducting layer. Additionally or alternatively, the method includes depositing a dielectric layer below the bottom surfaces of the emitters between the anode and cathode contacts.

In a disclosed embodiment, fabricating the plurality of vertical emitters includes depositing an etch-stop layer on the semiconductor substrate and fabricating the vertical emitters over the etch-stop layer, and removing the semiconductor substrate includes etching away the semiconductor substrate up to the etch-stop layer, and fabricating the plurality of vertical emitters includes fabricating vertical-cavity surface-emitting lasers on a GaAs substrate.

There is also provided, in accordance with an embodiment of the invention, an optoelectronic device, including a heat sink and a plurality of vertical emitters formed on a semiconductor substrate. The emitters have respective top surfaces bonded to the heat sink, and respective bottom surfaces from which the semiconductor substrate is removed. Anode and cathode contacts are both attached to the bottom surfaces of the vertical emitters so as to drive the emitters to emit light from the bottom surfaces.

There is additionally provided, in accordance with an embodiment of the invention, a method for production of an optoelectronic device, which includes fabricating a plurality of vertical emitters on an upper surface of a semiconductor substrate. The upper surface of the semiconductor substrate is bonded to a carrier substrate having through-holes that are aligned with respective top surfaces of the emitters. After bonding the upper surface to the carrier substrate, the semiconductor substrate is removed below respective bottom surfaces of the emitters. Electrical contacts are attached so as to drive the emitters to emit light from the top surfaces through the through-holes in the carrier substrate. The respective bottom surfaces of the emitters are bonded to a heat sink.

In a disclosed embodiment, bonding the upper surface includes soldering the upper surface of the semiconductor substrate to a lower surface of the heat sink. Typically, fabricating the plurality of vertical emitters includes fabricating vertical-cavity surface-emitting lasers on a GaAs substrate. Additionally or alternatively, the carrier substrate includes a silicon wafer, and wherein the method includes etching the through-holes through the silicon wafer.

There is further provided, in accordance with an embodiment of the invention, an optoelectronic device, including a semiconductor substrate and a plurality of vertical emitters fabricated on an upper surface of the semiconductor substrate. The vertical emitters have respective top and bottom surfaces, and the semiconductor substrate is removed below the bottom surfaces of the emitters. A carrier substrate having through-holes is bonded to the upper surface of the semiconductor substrate so that the through-holes are aligned with the respective top surfaces of the emitters. Electrical contacts are attached so as to drive the emitters to emit light from the top surfaces through the through-holes in the carrier substrate. A heat sink is bonded to the bottom surfaces of the emitters.

The present invention will be more fully understood from the following detailed description of the embodiments thereof, taken together with the drawings in which:

DETAILED DESCRIPTION OF EMBODIMENTS

Overview

VCSEL devices in operation generate a substantial amount of heat, which must be dissipated to a heat sink. VCSELs are typically produced on GaAs wafer substrates, which unfortunately have high thermal resistance. Therefore, even when the substrate is thinned, poor heat dissipation through the GaAs substrate limits the optical output power that can be achieved.

Some embodiments of the present invention that are described herein provide improved bottom-emitting VCSEL devices and techniques for fabrication of such devices, in which the VCSELs are bonded at their top sides directly to a heat sink with high thermal conductivity. The electrical contacts to the VCSELs, including both anode and cathode, can be made at the bottom side of the VCSEL wafer by using a through-wafer via configuration for the anodes, thus facilitating wafer-level testing even after bonding of the heat sink. This approach provides superior heat dissipation relative to commercially-available VCSEL devices, and thus increased optical output power and device uniformity. Furthermore, the device design is able to withstand high-temperature processes, such as annealing of metal contact layers.

At the same time, removal of the substrate below the emitting bottom surfaces of the VCSELs reduces optical absorption of the emitted radiation. This feature can be useful in extending the wavelength range over which the VCSELs can be operated to shorter wavelengths, below 900 nm.

In other embodiments, the VCSELs are produced in a top-emitting configuration, and a carrier substrate, such as a silicon wafer, is bonded to the top surface of the VCSEL array. This carrier wafer contains an array of through-holes that are aligned with the emitting surfaces of the VCSELs to allow the light emitted from the top side of the VCSELs to pass through the carrier wafer, as well as enabling electrical connections to be made to the anodes. After bonding to the carrier wafer, the back side of the VCSEL wafer is thinned and may be removed entirely, after which a heat sink is attached to the bottom of the VCSELs. These embodiments thus provide similar benefits of efficient heat dissipation from the VCSELs directly to the heat sink, since the original substrate between the heat sink and the VCSEL epitaxial layers has been nearly or completely removed.

Production System

Figure 1:
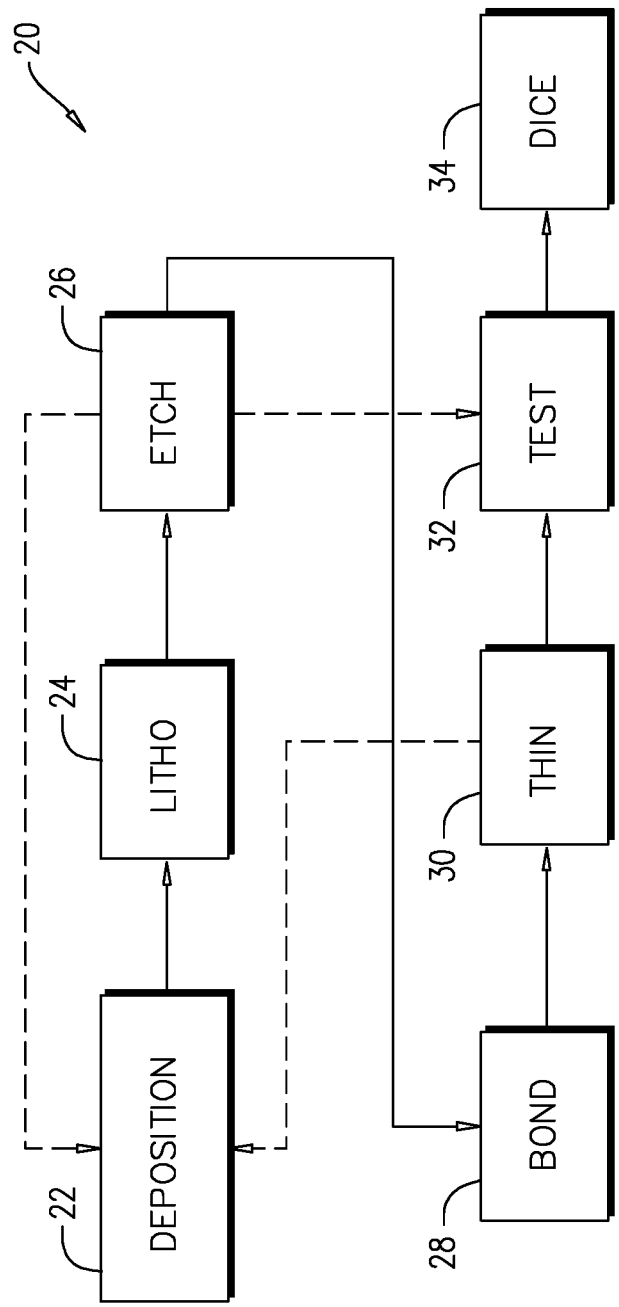
FIG. 1 is a block diagram that schematically illustrates a system for production of optoelectronic devices, in accordance with an embodiment of the invention.

FIG. 1 is a block diagram that schematically illustrates a system 20 for production of optoelectronic devices, in accordance with an embodiment of the invention. The elements of system 20, as described hereinbelow, comprise semiconductor process tools, which individually are known in the art and are commercially available from manufacturers of such equipment. In the present embodiments, however, these tools are arranged and applied in novel process modes.

Production of VCSEL arrays in system 20 begins with growth of appropriate epitaxial layers to produce vertical p-n junctions on a GaAs wafer in a deposition station 22. The layers are patterned in a lithography station 24 and then etched in an etching station 26 to create the desired structures. These steps may be repeated to build up multiple layers.

A bonding station 28 bonds the VCSEL array to a heat sink or carrier wafer, using a suitable solder or adhesive. The heat sink or carrier wafer provides mechanical support during subsequent thinning of the back side of the GaAs wafer, in a thinning station 30. This thinning may be carried out by mechanical and/or chemical processes, for example, and may be accompanied, in some embodiments, by etching of vias in the epitaxial layers, as well. In any case, thinning station 30 removes all or nearly all of the GaAs substrate, so that the epitaxial layers making up the VCSELs are exposed or nearly exposed at their back side.

At this point, one or more metal layers are typically applied to the back side of the VCSEL array and then etched to define anode and cathode connections to the VCSELs. A test station 32 can probe and apply current to these connections in order to test the operation of the VCSELs at the wafer level, and thus identify and discard bad VCSELs before dicing and packaging. Alternatively or additionally, testing can be applied to the packaged devices at a later stage. A dicing station 34 dices the VCSELs apart, together with the supporting structure (such as the heat sink and/or carrier wafer), to produce singulated emitters or emitter array chips. These chips are then mounted and/or packaged appropriately for their target application.

Back-Emitting VCSEL Array

FIGS. 2-5 are schematic sectional views of a flip-chip bonded bottom-emitting VCSEL array 40 at successive stages of fabrication, in accordance with an embodiment of the invention. These figures illustrate a wafer-scale process that can be used to produce both VCSEL arrays and singlet VCSEL devices.

Figure 2:
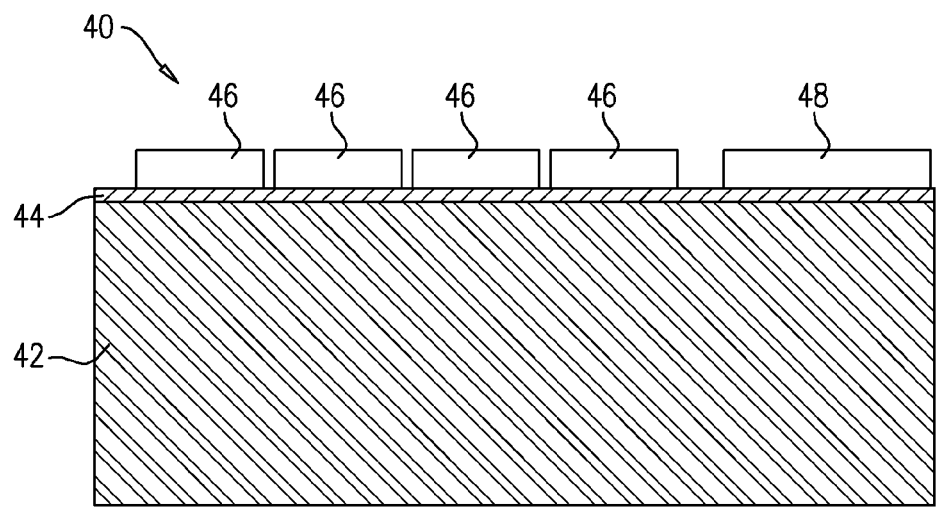
FIG. 2 is a schematic sectional view of a semiconductor wafer on which an array of VCSELs has been formed, in accordance with an embodiment of the invention.

As shown in FIG. 2, an etch-stop layer 44 is formed on a GaAs wafer substrate 42, after which VCSEL device layers are epitaxially grown over the etch-stop layer, using processes that are known in the art. For example, etch-stop layer 44 typically comprises InGaP, which is lattice-matched to GaAs substrate 42, and the VCSEL device layers are produced by Metal Organic Chemical Vapor Phase Deposition (MOCVD) or molecular beam epitaxy (MBE). The VCSEL device layers are etched to produce individual VCSELs 46, along with an auxiliary structure 48.

Figure 3:
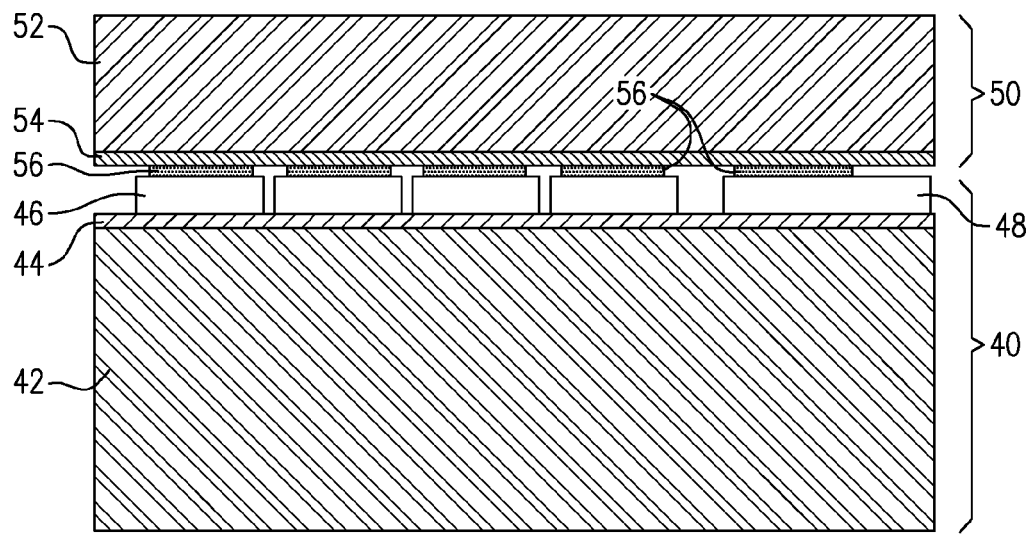
FIG. 3 is a schematic sectional view of the wafer of FIG. 2, showing bonding of a heat sink to the top surfaces of the VCSELs, in accordance with an embodiment of the invention.

FIG. 3 shows the next step in the process: bonding the upper surface of VCSEL array 40 to a heat sink 50, in the form of a carrier wafer 52 with high thermal conductivity. Wafer 52 can be made from any suitable material, such as a ceramic (for example, aluminum nitride), diamond, or silicon wafer, with a layer of high-temperature solder 54, such as AuGe or AuSn, to serve as a thermally and electrically conductive attachment layer on the bottom of wafer 52. An anode contact metal layer 56, comprising titanium, platinum, or gold, for example, is deposited on the top of all of VCSELs 46. Heat sink 50 is then typically bonded to VCSEL array 40 by means of flip-chip techniques, to bond metal layer 56 the upper surfaces of VCSELs 46 to solder layer 54, which serves as the thermal and electrical attachment layer between heat sink 50 and VCSELs 46.

Figure 4:
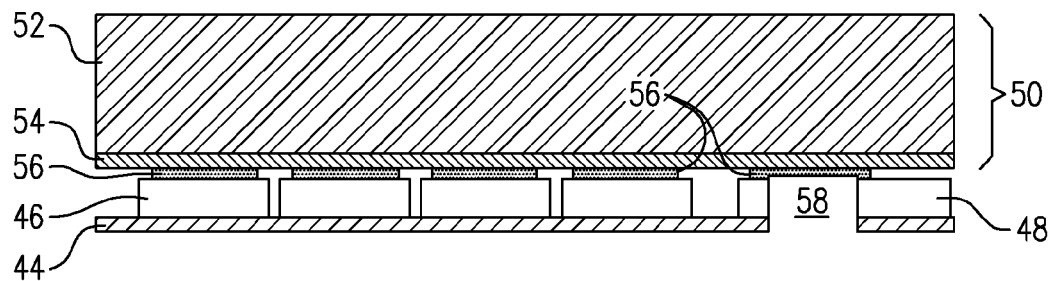
FIG. 4 is a schematic sectional view of the wafer and heat sink of FIG. 3, following thinning of the back side of the wafer, in accordance with an embodiment of the invention.

After bonding of heat sink 50, GaAs wafer substrate is thinned, using wafer thinning processes that are known in the art, such as grinding or lapping. The remaining portion of the substrate, up to etch-stop layer 44, is then removed by wet or dry etching, giving the result that is shown in FIG. 4. At this stage, heat sink 50 also serves as the mechanical support for VCSELs 46. Vias 58 are etched through the epitaxial layers of structure 48 to enable electrical connection between the top surfaces of VCSELs 46 and an anode contact in via 58.

Figure 5:
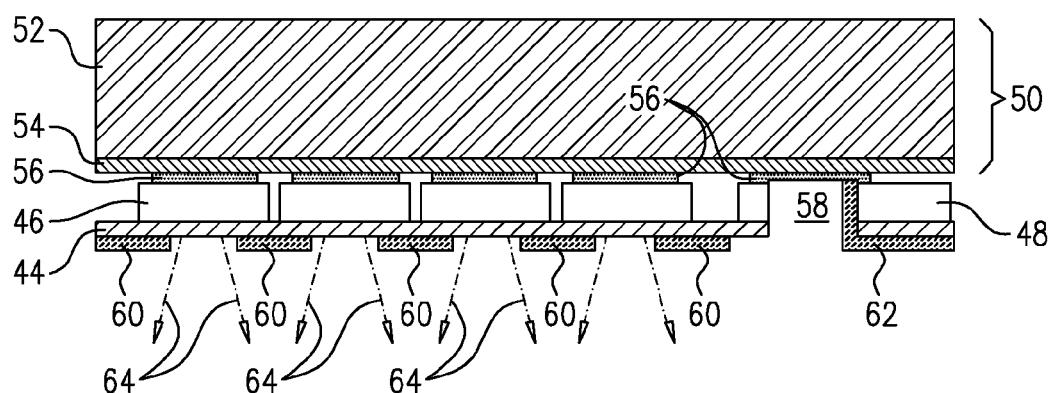
FIG. 5 is a schematic sectional view of the wafer and heat sink of FIG. 4 following metallization, illustrating backside emission of the VCSELs, in accordance with an embodiment of the invention.

As shown in FIG. 5, cathode contacts 60 and an anode contact 62 are formed on the bottom surface of VCSELs, below layer 44. Anode contact 62 extends through via 58 and connects to the top surfaces of VCSELs 46 via conductive attachment layer 54. Thus both cathode contacts 60 and anode contacts 62 are accessible at the bottom surface of the VCSEL array, enabling test station 32 to actuate VCSELs 46 during wafer-scale testing. When actuated, VCSELs 46 emit light 64 through the bottom surface of the array. Test station 32 can measure this emission and mark faulty components for discard or repair.

To improve the electrical isolation between cathode and anode contacts 60 and 62, an insulating (dielectric) layer (not shown in the figures) may be deposited or otherwise formed over the bottom surface of the VCSEL array, for example below layer 44. The thickness and composition of the dielectric layer may be chosen so that it also serves as an anti-reflection coating, thus increasing the optical power output from VCSELs 46. Additionally or alternatively, an isolation layer of this sort may be implanted in via 58, through which anode contact 62 passes.

Finally, the wafer-scale array of VCSELs 46, with bonded heat sink 50, is diced to create individual VCSEL arrays or singlets, which emit light through the bottom of the VCSEL structure as shown in FIG. 5.

Front-Emitting VCSEL Array

Figure 6:
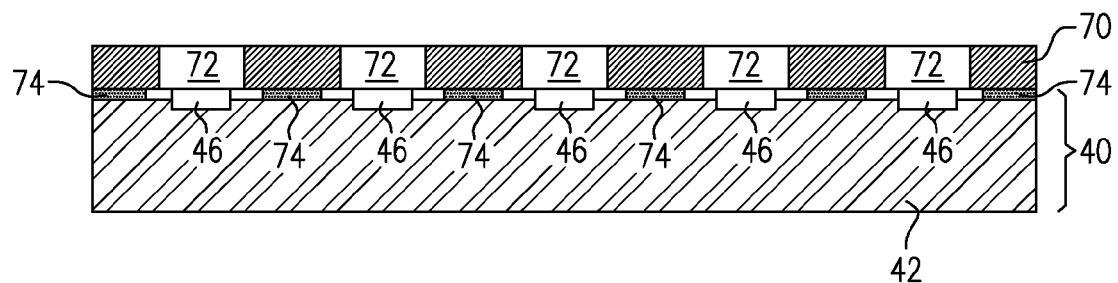
FIG. 6 is a schematic sectional view of a semiconductor wafer on which an array of VCSELs has been formed, following bonding of a carrier substrate to the front side of the wafer, in accordance with another embodiment of the invention.
Figure 7:
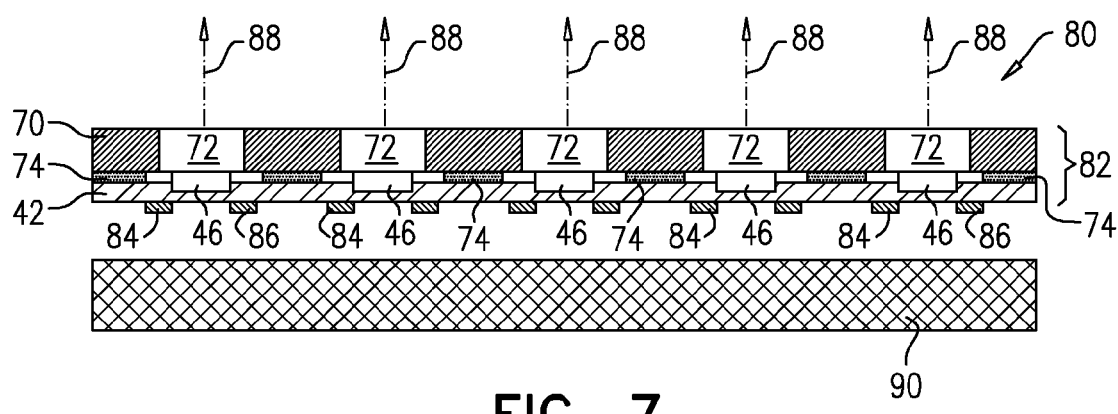
FIG. 7 is a schematic sectional view of the wafer and carrier substrate of FIG. 6 following thinning and metallization of the back side of the wafer, in accordance with an embodiment of the invention.

FIGS. 6 and 7 are schematic sectional views of a flip-chip bonded top-emitting array of VCSELs 46, in accordance with an alternative embodiment of the invention. In this embodiment, too, array 40 of VCSELs 46 is formed by epitaxial growth and lithographic etching on GaAs wafer 42, using processes that are known in the art.

As shown in FIG. 6, the top side of VCSEL array 40 is bonded onto a silicon wafer 70, typically about 250 μm thick, for example, which serves as the carrier wafer. Before bonding, an array of through-holes 72 is etched through wafer 70, with the holes matching the sizes and locations of the emitting top surfaces of VCSELs 46. The VCSEL and silicon wafers are aligned and bonded together by means of a flip-chip process, for example using a high-temperature solder 74, such as AuSn or AuGe, or another suitable adhesive.

After bonding, GaAs wafer 42 is thinned (typically down to about 10 μm thick), leaving an array structure 82 as shown in FIG. 7. Alternatively, wafer 42 may be completely removed, leaving behind only the epitaxial layers of VCSELs 46, as in the preceding embodiment. Metallization is applied to the bottom (n-side) of the thinned wafer 42, to form cathode and anode contacts 84, 86. When electrical current is applied between contacts 84 and 86, VCSELs 46 emit light 88 from their top sides, and the light exits through holes 72 in wafer 70.

The wafer-scale array structure 82, comprising VCSELs 46 and silicon wafer 70, is then diced to produce chips 80, comprising VCSEL arrays or singlet devices. The diced VCSEL devices are subsequently bonded onto a heat sink 90, with the epitaxial layers of VCSELs 46 in thermal contact with the heat sink surface either directly or through the thin remaining layer of wafer 42. Alternatively, heat sink 90 may be bonded to structure 82 at wafer scale, after which the entire assembly is diced.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for production of an optoelectronic device, comprising:
    fabricating a plurality of vertical emitters on a semiconductor substrate;
    bonding respective top surfaces of the emitters to a heat sink;
    after bonding the top surfaces, removing the semiconductor substrate below respective bottom surfaces of the emitters; and
    attaching both anode and cathode contacts to the bottom surfaces so as to drive the emitters to emit light from the bottom surfaces.

2. The method according to claim 1, and comprising:
    testing the emitters by applying currents between the anode and cathode comments; and
    after testing the emitters, dicing the heat sink along with the emitters bonded thereto.

3. The method according to claim 1, wherein bonding the top surfaces comprises soldering the top surfaces to a conducting layer at a lower surface of the heat sink.

4. The method according to claim 3, wherein fabricating the plurality of the vertical emitters comprises depositing epitaxial layers on the semiconductor substrate, and wherein attaching the anode contact comprises etching a via through the epitaxial layers, and extending the anode contact through the via to the conducting layer.

5. The method according to claim 1, and comprising depositing a dielectric layer below the bottom surfaces of the emitters between the anode and cathode contacts.

6. The method according to claim 1, wherein fabricating the plurality of vertical emitters comprises depositing an etch-stop layer on the semiconductor substrate and fabricating the vertical emitters over the etch-stop layer, and wherein removing the semiconductor substrate comprises etching away the semiconductor substrate up to the etch-stop layer.

7. The method according to claim 1, wherein fabricating the plurality of vertical emitters comprises fabricating vertical-cavity surface-emitting lasers on a GaAs substrate.

8. An optoelectronic device, comprising:
   a heat sink;
   a plurality of vertical emitters formed on a semiconductor substrate, the emitters having respective top surfaces bonded to the heat sink, and respective bottom surfaces from which the semiconductor substrate is removed; and
   anode and cathode contacts, both attached to the bottom surfaces of the vertical emitters so as to drive the emitters to emit light from the bottom surfaces.

9. The device according to claim 8, wherein the heat sink comprises a conducting layer at a lower surface thereof, and wherein the top surfaces of the vertical emitters are soldered to the conducting layer.

10. The device according to claim 9, wherein the vertical emitters comprise epitaxial layers formed on the semiconductor substrate, and wherein the anode contact extends through a via that is etched through the epitaxial layers to the conducting layer.

11. The device according to claim 8, and comprising a dielectric layer deposited below the bottom surfaces of the emitters between the anode and cathode contacts.

12. The device according to claim 8, and comprising an etch-stop layer below the vertical emitters.

13. The device according to claim 8, wherein the vertical emitters comprise vertical-cavity surface-emitting lasers, and the semiconductor substrate comprises a GaAs substrate.

* * * * *